（12）United States Patent
Miyawaki

(10) Patent No.: US 6,282,142 B1
(45) Date of Patent: Aug. 28, 2001

(54) SEMICONDUCTOR MEMORY DEVICE

(75) Inventor: Masafumi Miyawaki, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/635,238

(22) Filed: Aug. 9, 2000

(30) Foreign Application Priority Data

Oct. 13, 1999 (JP) .................................................. 11-290881

(51) Int. Cl.7 ...................................................... G11C 8/00

(52) U.S. Cl. ...................... 365/230.03; 365/196; 365/207

(58) Field of Search .................................... 365/203, 191, 365/202, 230.03, 196, 207

(56) References Cited

U.S. PATENT DOCUMENTS

| | | | |
|---|---|---|---|
| 5,917,744 | * | 6/1999 | Kirihata et al. ......................... 365/63 |
| 6,125,071 | * | 9/2000 | Kohno et al. .................... 365/230.03 |
| 6,147,918 | * | 11/2000 | Takashima et al. .................. 365/207 |
| 6,154,402 | * | 11/2000 | Akita ..................................... 365/203 |

* cited by examiner

Primary Examiner—David Nelms
Assistant Examiner—Thong Le
(74) Attorney, Agent, or Firm—Jones Volentine, PLLC

(57) ABSTRACT

Sense amplifiers are respectively located at both ends of a bit line pair. These sense amplifiers amplify a voltage difference between the bit line pair in response to a sense amplifier active signal during a sensing period. Since the voltage difference between the bit line pair is amplified at the both ends of the bit line pair, the time spent amplifying the voltage between the bit line pair may be shortened.

20 Claims, 9 Drawing Sheets

SEMICONDUCTOR MEMORY DEVICE

The present application claiming priority under 35 U.S.C. §119 to Japanese Application No. 11-290881 filed on Oct. 13, 1999, which is hereby incorporated by reference in its entirely for all purposes.

BACKGROUND OF THE INVENTION

1. Field of the Invention

The present invention relates to a semiconductor memory device, and particularly, the present invention relates to a device suitable for applying to a dynamic type random access memory.

2. Description of the Related Art

A dynamic type random access memory (DRAM) is applied to various electronic products, such as an image data memory and a personal computer.

In recent years, such electronic products including DRAMs have been more and more required to operate at high speeds. Also, in order to realize such high speed operation, the DRAMs themselves are requested to operate at higher speed. A read operation which reads out data form memory cells of the DRAM is particularly required to be shortened.

In the case where the high speed operation of the DRAM is realized, it is desirable to avoid complicating the process to manufacture such a DRAM. Because as processes of the DRAM become complex, the cost of the DRAM becomes higher. It is also desirable to minimize the number of transistors used. This is because as the number of transistors is minimized, the size of the DRAM is reduced.

SUMMARY OF THE INVENTION

The first object of the invention is to provide a semiconductor memory device, such as a DRAM which functions of a high speed operation without complicating processes for the semiconductor memory device.

The second object of the invention is to provide such semiconductor device which is comprised of minimum transistors in order to reduce the size thereof.

To achieve the object, in a preferred embodiment of the invention, sense amplifiers are respectively located at both ends of bit line pair. These sense amplifiers amplify a voltage difference between the bit line pair in response to a sense amplifier active signal during a sensing period.

According to the present invention, since the voltage difference between the bit line pair are amplified at the both ends of the bit line pair, the time spent amplifying the voltage between the bit line pair may be shortened.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, a first preferred embodiment is shown in which the present invention is applied to a DRAM (Dynamic Random Access Memory).

Figure 1:
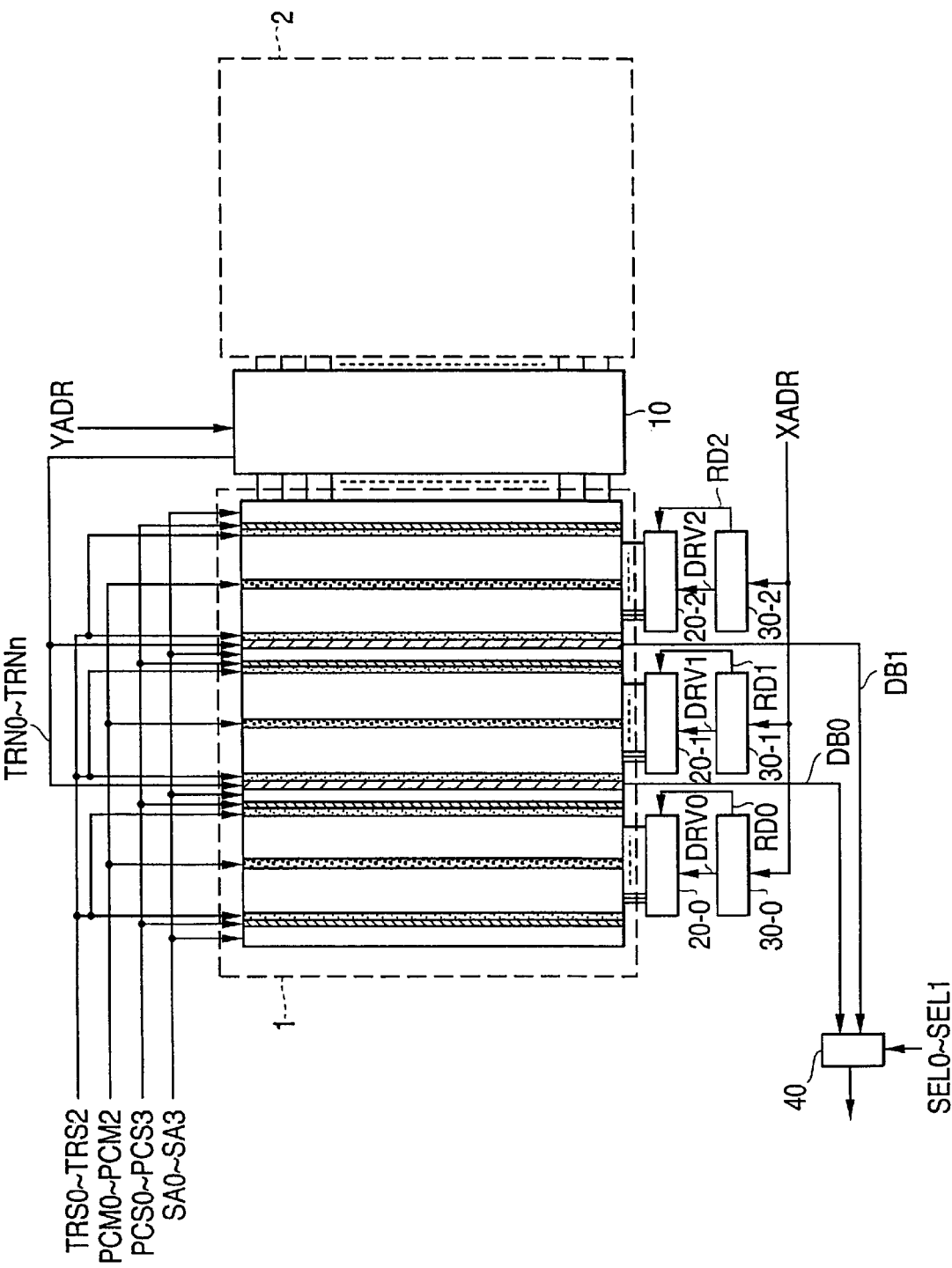
FIG. 1 is a partial block diagram of a semiconductor memory device according to a first preferred embodiment.

FIG. 1 is a partial block diagram of a first preferred embodiment the DRAM. The DRAM includes memory cell arrays 1 and 2, a column address decoder 10, word line loading circuits 20-0, 20-1 and 20-2, row address decoders 30-0, 30-1 and 30-2 and a selecting circuit 40.

The column address decoder 10 is arranged between the memory cell array 1 and the memory cell array 2 and decodes an address YADR which is comprised of a few bits. The address YADR is part of a main address which is comprised of several bits. The column address decoder 10 outputs first transfer control signals TRN0 . . . TRNn which have either a power supply voltage level (high level, hereinafter "H") or a ground voltage level (low level, hereinafter "L") based on the decoding of the address YADR. The column decoder 10 sets a voltage level of one of the first transfer signals TRN0 . . . TRNn to "H" and sets voltages of the other first transfer signals to "L".

The row address decoder 30-0, 30-1 and 30-2 decode an address XADR which is comprised of a few bits different from the few bit of the address YADR. The address XADR is part of the main address. The row address decoder 10 outputs active signals DRV0 . . . DRV2 to the word line loading circuits 20-0 . . . 20-2. The active signals DRV0 . . . DRV2 is supplied to word lines which are connected to memory cells which are selected by the main address.

In the case where redundancy memory cells are used instead of the defective memory cells which are selected by the main address, the row address decoder 10 outputs redundant signals RD0 . . . RD2 to the word line loading circuits 20-0 . . . 20-2.

The word line loading circuit 20-0 . . . 20-2 respectively cause one of the word lines to be active in response to the active signal DRV0 . . . DRV2. In this embodiment, one of the word lines which are activated by the word line loading circuit 20-0 . . . 20-2 is activated. To activated the word line means that a logic level of the word line is set to "H" from an initial state "L".

The selecting circuit 40 selects one pair from data transfer signal line pairs DB0 and DB1 in response to selecting signals SEL0, SEL1 and outputs an output signal which corresponds to signals on the selected data transfer signal line pair. The data transfer signal line pairs DB0, DB1 transfer data which are read from the memory cells.

The selecting circuit 40 selects the data transfer signal line pair DB0, when a logic level of the selecting signal SEL0 is "H". The selecting circuit 40 selects the data transfer signal line pair DB1, when a logic level of the selecting signal SEL1 is "H". The selecting circuit 40 outputs a high-impedance signal or a fixed signal which has a predetermined voltage level despite the level of the data transfer signal line pairs DB0, DB1, when logic levels of the selecting signals SEL0, SEL1 are "L".

Since the selecting signals SEL0, SEL1 relate to the data transfer signal line pairs DB0, DB1, the first transfer control signals TRN0, TRN1 can be used instead of the selecting signal SEL0, SEL1. Further, one selecting signal SEL instead of the two selecting signal SEL0, SEL1 can be applied. For example, the selecting circuit 40 selects the data transfer signal line pair DB0, when a logic level of the selecting signal SEL is "L" and selects the data transfer signal line pair DB1, when a logic level of the selecting signal SEL is "H". That is effective in the case where the data on either the data transfer signal line pairs DB0 or DB1 are output at all times.

The selecting circuit 40 can be omitted, but it is effective in the case where latter data are output from the selecting circuit 40 after outputting former data. That is, the latter data does not have an influence on the former data by the selecting circuit 40.

In FIG. 1, second transfer control signals TRS0 . . . TRS2, first pre-charging signals PCM0 . . . PCM2, second pre-charging signals PCS0 . . . PCS3 and sense amplifier active signals SA0 . . . SA3 are shown. A description about these signals will be described hereinafter. Such signals are generated from a timing signal generating circuit (not shown). The timing signal generating circuit generates such signals in response to a row address strove signal (RAS), a column address strove signal (CAS) and a writing control signal WE.

In the DRAM shown in FIG. 1, the column address decoder 10 and the row address decoders 30-0, 30-1 and 30-2 select a memory cell based on the main address including the addresses YADR and XADR. Then, data which is stored in the selected memory cell is read out, or a predetermined data is written into the selected memory cell through either the data transfer signal line pairs DB0 or DB1.

Figure 2:
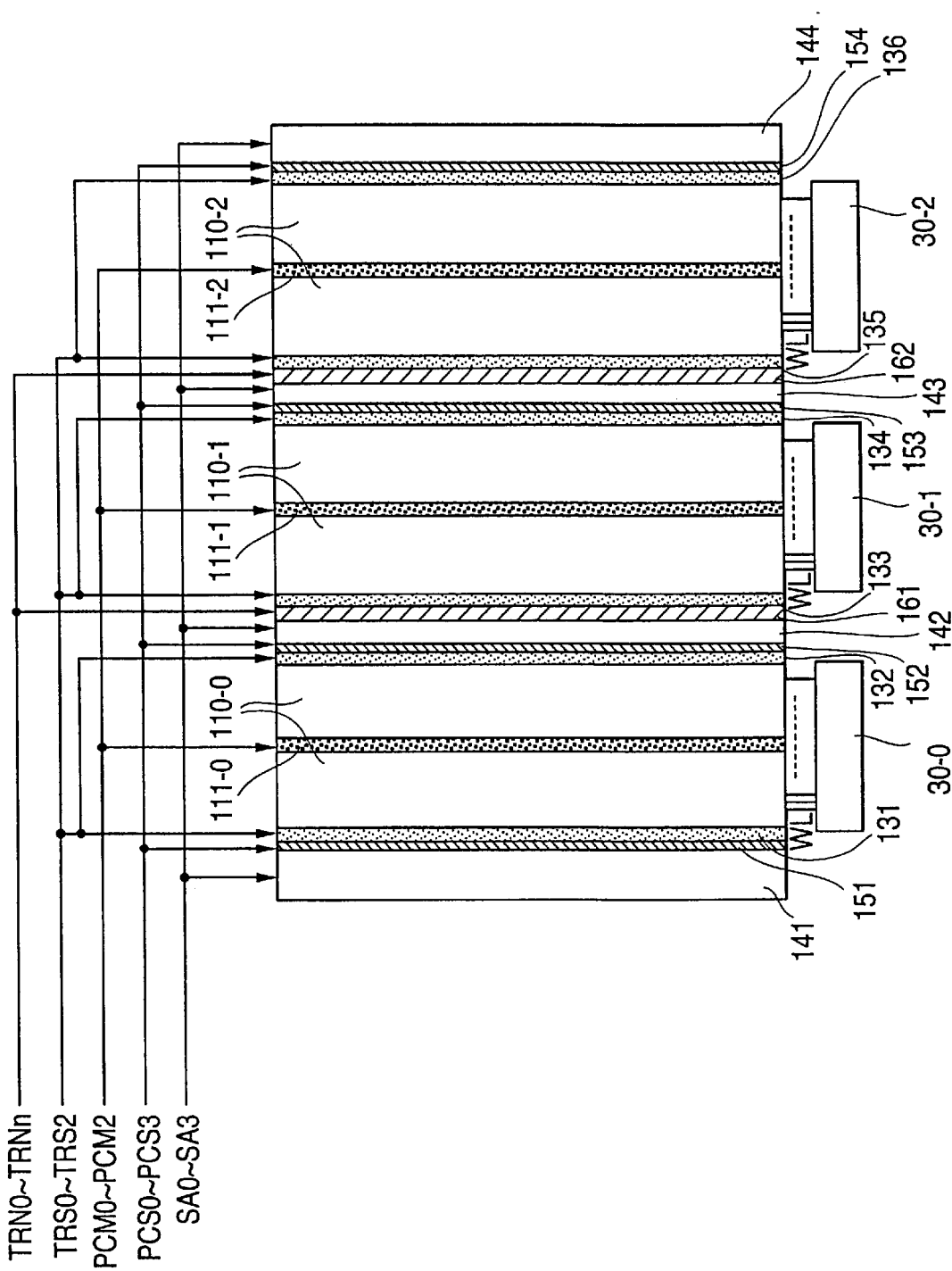
FIG. 2 is a block diagram of a memory cell array 1 shown in FIG. 1.

The memory cell arrays 1, 2 will be described, referring to FIG. 2 illustrating the memory cell array 1. A description about the memory cell array 2 is omitted since the memory cell array 2 is similar to the memory cell array 1.

The memory cell array 1 includes memory cell blocks 110-0 . . . 110-2, first pre-charging circuit blocks 111-0 . . . 111-2, transfer control circuit blocks 131 . . . 136, sense amplifier blocks 141 . . . 144, second pre-charging circuit blocks 151 . . . 154 and gate circuit blocks 161, 162.

In the memory cell blocks 110-0 . . . 110-2, a plurality of memory cells are arranged in lengthwise and crosswise. Each memory cell is connected to one of a bit line pair described below and one of the word lines. Each memory cell in the memory cell block 110-0 is connected to one of the word lines which are activated by the word line loading circuit 30-0. Each memory cell in the memory cell block 110-1 is connected to one of the word lines which are activated by the word line loading circuit 30-1. Each memory cells in the memory cell block 110-2 is connected to one of the word lines which are activated by the word line loading circuit 30-2.

The first pre-charging circuit blocks 111-0 . . . 111-2 are respectively comprised of a plurality of pre-charging circuits which set voltages of the bit line pairs to a predetermined voltage, such as a half voltage of the power supply voltage. The pre-charging circuits in the pre-charging circuit blocks 111-0 . . . 111-2 become active in response to the pre-charging signals PCM0 . . . PCM2 and set voltages of the bit line pairs to the predetermined voltage. When a voltage level of the pre-charging signal PCM0 is "H", the pre-charging circuits in the pre-charging block 111-0 are activated. When a voltage level of the pre-charging signal PCM0 is "L", the pre-charging circuits in the pre-charging block 111-0 are not activated and do not set the voltages of the bit line pairs to the predetermined voltage. Similarly, the pre-charging circuits in the pre-charging blocks 111-1, 111-2 are controlled by the pre-charging signals PCM1, PCM2. A diagram on the pre-charging circuit will be shown hereinafter.

The first precharging circuit blocks 111-0 . . . 111-2 are desirable to arrange at the center of memory cell blocks 110-0 . . . 110-2 in order to pre-charge all of the bit line pairs uniformly and rapidly. In this way, ends of the bit line pairs can be pre-charged rapidly.

The transfer control blocks 131 . . . 136 are respectively arranged between the memory cell array blocks 110-0 . . . 110-2 and the sense amplifier blocks 141 . . . 144. The transfer control blocks 131 . . . 136 are respectively comprised of plural transfer control circuits which connect the plural bit line pairs with plural signal lines that are respectively connected to plural sense amplifier in the sense amplifier blocks 141 . . . 144 in response to the second transfer signals TRS0 . . . TRS2.

The transfer control blocks 131 and 132 connect the bit line pair which are connected to the memory cells in the memory cell blocks 110-0 with the sense amplifier blocks 141 and 142 in order to transfer data, when a logic level of the transfer control signal TRS0 is "H". The transfer control blocks 131 and 132 disconnect the bit line pair in the memory cell blocks 110-0 with the sense amplifier blocks 141 and 142, when a logic level of the transfer control signal TRS0 is "L".

Similarly, the transfer control blocks 133 and 134 connect the bit line pair which are connected to the memory cells in the memory cell blocks 110-1 with the sense amplifier blocks 142 and 143 in order to transfer data, when a logic level of the transfer control signal TRS1 is "H". The transfer control blocks 133 and 134 disconnect the bit line pair in the memory cell blocks 110-1 with the sense amplifier blocks 142 and 143, when a logic level of the transfer control signal TRS1 is "L".

Similarly, the transfer control blocks 135 and 136 connect the bit line pair which are connected to the memory cells in the memory cell blocks 110-2 with the sense amplifier blocks 143 and 144 in order to transfer data, when a logic level of the transfer control signal TRS2 is "H". The transfer control blocks 135 and 136 disconnect the bit line pair in the memory cell blocks 110-2 with the sense amplifier blocks 143 and 144, when a logic level of the transfer control signal TRS2 is "L".

The sense amplifier blocks 141 . . . 144 include plural signal line pairs and plural sense amplifiers which are respectively connected to the signal line pairs. The sense amplifiers in the sense amplifier block 141 are controlled by a sense amplifier activating signal SA0. The sense amplifiers in the sense amplifier block 141 are active and amplify voltage differences between the signal line pairs which are connected thereto, when a logic level of the sense amplifier activating signal SA0 is "H". The sense amplifiers are inactive and don't amplify the voltage differences between the signal line pairs, when a logic level of the sense amplifier activating signal SA0 is "L".

Similarly, the sense amplifiers in the sense amplifier block 142 are active and amplify voltage differences between the signal line pairs which are connected thereto, when a logic level of the sense amplifier activating signal SA1 is "H". The sense amplifiers are inactive and don't amplify voltage differences between the signal line pairs, when a logic level of the sense amplifier activating signal SA1 is "L".

Similarly, the sense amplifiers in the sense amplifier block 143 are active and amplify voltage differences between the signal line pairs which are connected thereto, when a logic level of the sense amplifier activating signal SA2 is "H". The sense amplifiers are inactive and don't amplify voltage differences between the signal line pairs, when a logic level of the sense amplifier activating signal SA2 is "L".

Similarly, the sense amplifiers in the sense amplifier block 144 are active and amplify voltage differences between the signal line pairs which are connected thereto, when a logic level of the sense amplifier activating signal SA2 is "H". The sense amplifiers are inactive and don't amplify voltage differences between the signal line pairs, when a logic level of the sense amplifier activating signal SA2 is "L".

Second pre-charging circuit blocks 151 . . . 154 are respectively comprised of a plurality of pre-charging circuits which set voltages of the plural signal line pairs in the sense amplifier block 141 . . . 144 to a predetermined voltage, such as a half voltage of the power supply voltage. The pre-charging circuits in the second precharging circuit blocks 151 . . . 154 become active in response to the pre-charging signals PCS0 . . . PCS3 and set voltages of the signal line pairs to the predetermined voltage. When a voltage level of the pre-charging signal PCS0 is "H", the pre-charging circuits in the pre-charging block 151 are activated. When a voltage level of the pre-charging signal PCS0 is "L", the pre-charging circuits in the pre-charging block 151 are not activated and do not set the voltages of the signal line pairs to the predetermined voltage. Similarly, the pre-charging circuits in the pre-charging blocks 152 . . . 154 are controlled by the pre-charging signals PCS1, PCS2, PCS3. A diagram on the pre-charging circuit will be shown below.

The gate circuit blocks 161, 162 are comprised of a plurality of gate circuits which control a data transmission between the signal line pairs and the data transfer signal line pairs DB0, DB1.

The plurality of gate circuits are arranged so as to correspond with the bit line pairs. The gate circuits in the gate circuit block 161 are controlled by first transfer control signals TRN0 . . . TRNn (n is an integral number greater than or equal to 2). The gate circuits CNk0 (0≦k≦n) described below in the gate circuit block 161 are active and transfers data on the signal line pair which is connected thereto to the data transfer signal line pair DB0, when a logic level of the first transfer control signal TRNk is "H". The gate circuit are inactive and does not transfer data on the signal line pair to the data transfer signal line pair DB0, when a logic level of the first transfer control signal TRNk is "L".

Similarly, the gate circuits in the gate circuit block 162 are controlled by first transfer control signals TRN0 . . . TRNn. The gate circuits CNk1 described below in the gate circuit block 162 are active and transfer data on the signal line pair which is connected thereto to the data transfer signal line pair DB1, when a logic level of the first transfer control signal TRNk is "H". The gate circuits CNk1 are inactive and do not transfer data on the signal line pair to the data transfer signal line pair DB1, when a logic level of the first transfer control signal TRNk is "L".

An outline of a read out operation in this memory cell array 1 will be described below.

The signal line pairs in the sense amplifier blocks 141 . . . 144 are set the predetermined voltage level (pre-charging voltage level) by the plurality of pre-charging circuits in the second pre-charging circuit block and the bit line pairs in the memory cell blocks 110-0 . . . 110-2 are set to the pre-charging voltage level by the pre-charging circuits in the first pre-charging circuit block.

After such pre-charging, the word line loading circuits 30-0 . . . 30-2 select one word line from the plural word lines. Then, a data is read out from a memory cell which is connected to the one word line and is provided to the bit line pair which is connected to the memory cell. Data transfer control circuits of two data transfer control circuit blocks which are both sides of the bit line pair which is provided the data thereto are activated. In other words, the bit line pair is sandwiched between the two data transfer control circuits.

Then, the sense amplifiers in the sense amplifier blocks which are connected to the activated data transfer control circuit blocks amplify the voltage differences (corresponding the data) between the signal lines which are provided the data from the bit line pair.

The amplified data is transferred to the data transfer signal line pair DB0 or DB1 through one gate circuit in the gate circuit blocks 161, 162. The data on the data transfer signal line pair DB0, DB1 is selectively outputted from the selecting circuit 40 in response to the selecting signals SEL0 or SEL1.

In the foregoing case, only the data readout operation is described. The data write operation will be easily understood by persons skilled in the art with reference to the foregoing description of the operation.

Figure 3:
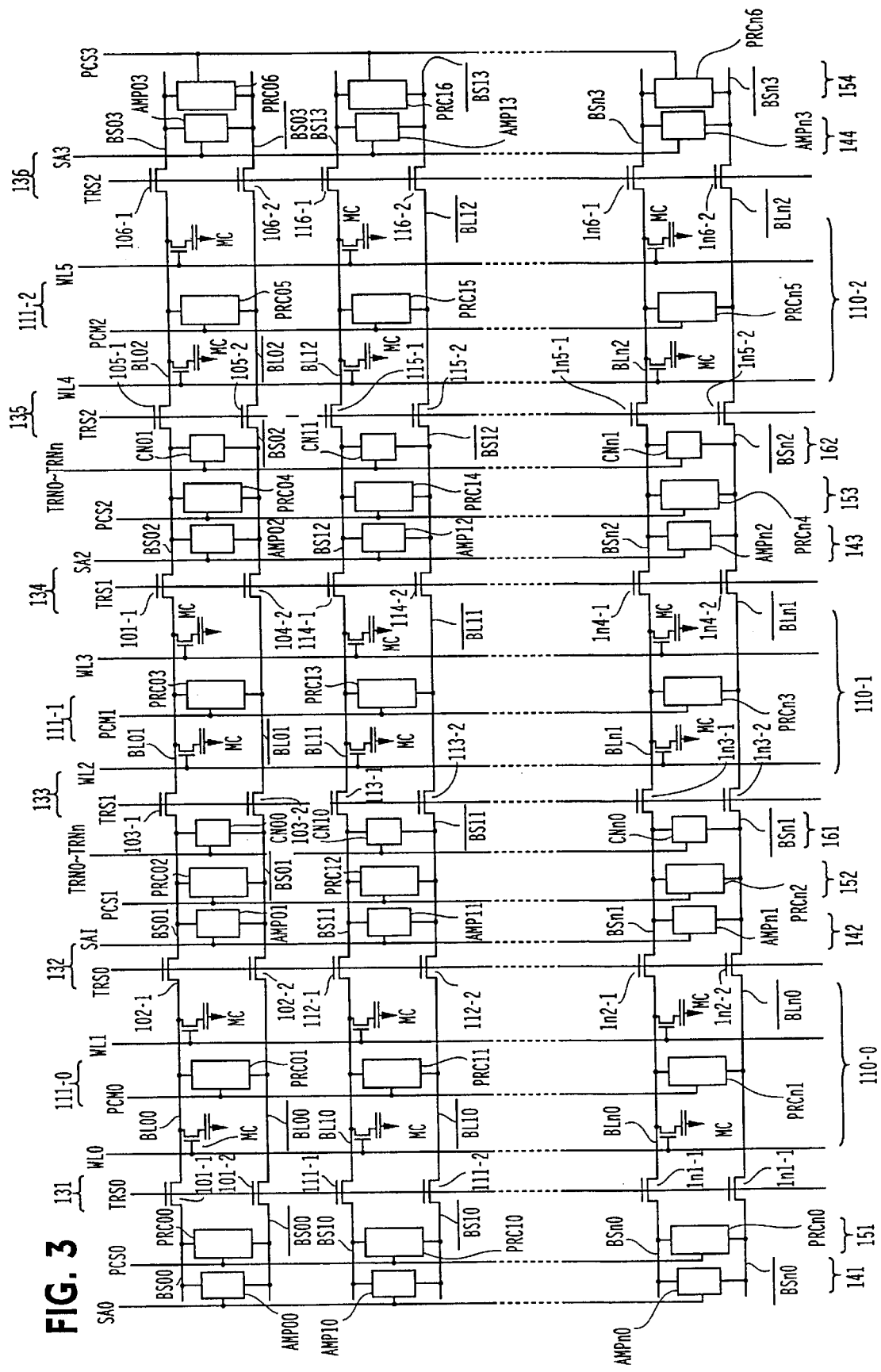
FIG. 3 is a partial circuit diagram of the semiconductor memory device according to the first preferred embodiment.

Here, specific circuits of every block in the memory cell array 1 are shown in FIG. 3.

As shown in FIG. 3, the memory cell block 110-0 includes bit line pairs "BL00, /BL00", "BL10, /BL10" . . . "BLn0, /Bln0" (n≧2) and a plurality of memory cells MC. Each memory cell MC is connected to one of the bit line pairs. Each memory cell is the same configuration, that is, each memory cell is comprised of one capacitor and one MOS transistor.

Similarly, the memory cell block 110-1 includes bit line pairs "BL01, /BL01", "BL11, /BL11" . . . "BLn1, /Bln1" and a plurality of memory cells MC. Each memory cell MC is connected to one of the bit line pairs. The memory cell block 110-2 includes bit line pairs "BL02, /BL02", "BL12, /BL12" . . . "BLn2, /Bln2" and plural memory cells MC. Each memory cell MC is connected to one of the bit line pairs.

The memory cells in the memory cell block 110-0 are respectively connected to either a word line WL0 or a word line WL1. Similarly, The memory cells in the memory cell block 110-1 are respectively connected to either a word line WL2 or a word line WL3. The memory cells in the memory cell block 110-2 are respectively connected to either a word line WL4 or a word line WL5.

The first pre-charging circuit block 111-0 includes plural pre-charging circuits PRC01 . . . PRCn1 which are connected to the bit line pairs "BL00, /BL00", "BL10, /BL10" . . . "BLn0, /Bln0". Similarly, the first pre-charging circuit block 111-1 includes plural pre-charging circuits PRC03 . . . PRCn3 which are connected to the bit line pairs "BL01, /BL01", "BL11, /BL11" . . . "BLn1, /Bln1". Similarly, the first pre-charging circuit block 111-2 includes plural pre-charging circuits PRC05 . . . PRCn5 which are connected to the bit line pairs "BL02, /BL02", "BL12, /BL12" . . . "BLn2, /Bln2".

The pre-charging circuit PRC01 . . . PRCn1 receives the first pre-charging signal PCM0, the pre-charging circuit PRC03 . . . PRCn3 receives the first pre-charging signal PCM1 and the pre-charging circuit PRC05 . . . PRCn5 receives the first pre-charging signal PCM2.

The transfer control block 131 is comprised of plural N channel type MOS transistors 101-1, 101-2, 111-1, 111-2 . . . 1n1-1,1n1-2. The transfer control block 132 is comprised of a plurality of N channel type MOS transistors 102-1, 102-2, 112-1, 112-2 . . . 1n2-1, 1n2-2. The transfer control block 133 is comprised of a plurality of N channel type MOS transistors 103-1, 103-2, 113-1, 113-2 . . . 1n3-1,1n3-2. The transfer control block 134 is comprised of a plurality of N channel type MOS transistors 104-1, 104-2, 114-1, 114-2 . . . 1n4-1, 1n4-2. The transfer control block 135 is comprised of a plurality of N channel type MOS transistors 105-1, 105-2, 115-1, 115-2 . . . 1n5-1, 1n5-2. The transfer control block 136 is comprised of a plurality of N channel type MOS transistors 106-1, 106-2, 116-1, 116-2 . . . 1n6-1,1n6-2. In this embodiment, a pair of N channel type MOS transistor which are connected to the bit line pair is called a transfer control circuit.

Gate electrodes of the N channel type MOS transistor 101-1, 101-2 . . . 1n1-1, 1n1-2 of the transfer control block 131 and the N channel type MOS transistor 102-1, 102-2 . . . 1n2-1, 1n2-2 of the transfer control block 132, receive the second transfer control signal TRS0. Gate electrodes of the N channel type MOS transistor 103-1, 103-2 . . . 1n3-1, 1n3-2 of the transfer control block 133 and the N channel type MOS transistor 104-1, 104-2 . . . 1n4-1, 1n4-2 of the transfer control block 134, receive the second transfer control signal TRS1. Gate electrodes of the N channel type MOS transistor 105-1, 105-2 . . . 1n5-1, 1n5-2 of the transfer control block 135 and the N channel type MOS transistor 105-1, 105-2 . . . 1n5-1, 1n5-2 of the transfer control block 136, receive the second transfer control signal TRS2.

First electrodes of the N type MOS transistors 101-1, 111-1 . . . 1n1-1 are connected to bit lines BL00, BL10 . . . BLn0 and second electrodes are connected to signal lines BS00, BS10 . . . BSn0. First electrodes of the N type MOS transistors 101-2, 111-2 . . . 1n1-2 are connected to bit lines /BL00, /BL10 . . . /BLn0 and second electrodes are connected to signal lines /BS00, /BS10 . . . /BSn0.

First electrodes of the N type MOS transistors 102-1, 112-1 . . . 1n2-1 are connected to bit lines BL00, BL10 . . . BLn0 and second electrodes are connected to signal lines BS01, BS11 . . . BSn1. First electrodes of the N type MOS transistors 102-2, 112-2 . . . 1n2-2 are connected to bit lines /BL00, /BL10 . . . /BLn0 and second electrodes are connected to signal lines /BS01, /BS11 . . . /BSn1.

Similarly, first electrodes of the N type MOS transistors 10(2j–1)-1, 11(2j–1)-1 . . . 1n(2j–1)-1 are connected to bit lines BL0(j–1), BL1(j–1) . . . BLn(j–1) and second electrodes are connected to signal lines BS0(j–1), BS1(j–1) . . . BSn(j–1). "j" is two or three. First electrodes of the N type MOS transistors 10(2j–1)-2, 11(2j–1)-2 . . . 1n(2j–1)-2 are connected to bit lines /BL0(j–1), /BL1(j–1) . . . /BLn(j–1) and second electrodes are connected to signal lines /BS0(j–1), /BS1(j–1) . . . /BSn(j–1).

Similarly, first electrodes of the N type MOS transistors 10(2j)-1, 11(2j)-1 . . . 1n(2j)-1 are connected to bit lines BL0(j–1), BL1(j–1) . . . BLn(j–1) and second electrodes are connected to signal lines BS0(j), BS1(j) . . . BSn(j). First electrodes of the N type MOS transistors 10(2j)-2, 11(2j)-2 . . . 1n(2j)-2 are connected to bit lines /BL0(j–1), /BL1(j–1) . . . /BLn(j–1) and second electrodes are connected to signal lines /BS0(j), /BS1(j) . . . /BSn(j).

The second pre-charging circuit block 151 includes a plurality of pre-charging circuits PRC00, PRC10 . . . PRCn0 which are connected to the signal line pairs "BS00, /BS00", "BS10, /BS10" . . . "BSn0, /BSn0". The second pre-charging circuit block 152 includes a plurality of pre-charging circuits PRC02, PRC12 . . . PRCn2 which are connected to the signal line pairs "BS01, /BS01", "BS11, /BS11" . . . "BSn1, /BSn1". The second pre-charging circuit block 153 includes a plurality of pre-charging circuits PRC04, PRC14 . . . PRCn4 which are connected to the signal line pairs "BS02, /BS02", "BS12, /BS12" . . . "BSn2, /BSn2". The second pre-charging circuit block 154 includes a plurality of pre-charging circuits PRC06, PRC16 . . . PRCn6 which are connected to the signal line pairs "BS03, /BS03", "BS13, /BS13" . . . "BSn3, /BSn3".

The pre-charging circuits PRC00 . . . PRCn0 receive the second pre-charging signal PCS0, the pre-charging circuits PRC02 . . . PRCn2 receive the second pre-charging signal PCS1, the pre-charging circuits PRC04 . . . PRCn4 receive in the second pre-charging signal PCS2 and the pre-charging circuits PRC06 . . . PRCn6 recieve the second pre-charging signal PCS3.

The sense amplifier block 141 is comprised of a plurality of sense amplifier circuits AMP00, AMP10 . . . AMPn0 which are connected to the signal line pairs "BS00, /BS00", "BS10, /BS10" . . . "BSn0, /BSn0". The sense amplifier block 142 is comprised of a plurality of sense amplifier circuits AMP01, AMP11 . . . AMPn1 which are connected to the signal line pairs "BS01, /BS01", "BS11, /BS11" . . . "BSn1, /BSn1". The sense amplifier block 143 is comprised of a plurality of sense amplifier circuits AMP02, AMP12 . . . AMPn2 which are connected to the signal line pairs "BS02, /BS02", "BS12, /BS12" . . . "BSn2, /BSn2". The sense amplifier block 144 is comprised of a plurality of sense amplifier circuits AMP03, AMP13 . . . AMPn3 which are connected to the signal line pairs "BS03, /BS03", "BS13, /BS13" . . . "BSn3, /BSn3".

The sense amplifier circuits AMP00 . . . AMPn0 receive the sense amplifier activating signal SA0, the sense amplifier circuits AMP01 . . . AMPn1 receive the sense amplifier activating signal SA1, the sense amplifier circuits AMP02 . . . AMPn2 receive the sense amplifier activating signal SA2 and the sense amplifier circuits AMP03 . . . AMPn3 receive the sense amplifier activating signal SA3.

The gate circuit block 161 is comprised of a plurality of gate circuits CN00, CN10 . . . CNn0 which are connected to the signal line pairs "BS01, /BS01", "BS11, /BS11" . . . "BSn1, /BSn1". The gate circuit block 162 is comprised of a plurality of gate circuits CN01, CN11 . . . CNn1 which are connected to the signal line pairs "BS02, /BS02", "BS12, /BS12" . . . "BSn2, /BSn2". The gate circuits CNk0, CNk1 receive the transfer control signal TRNk.

Figure 4:
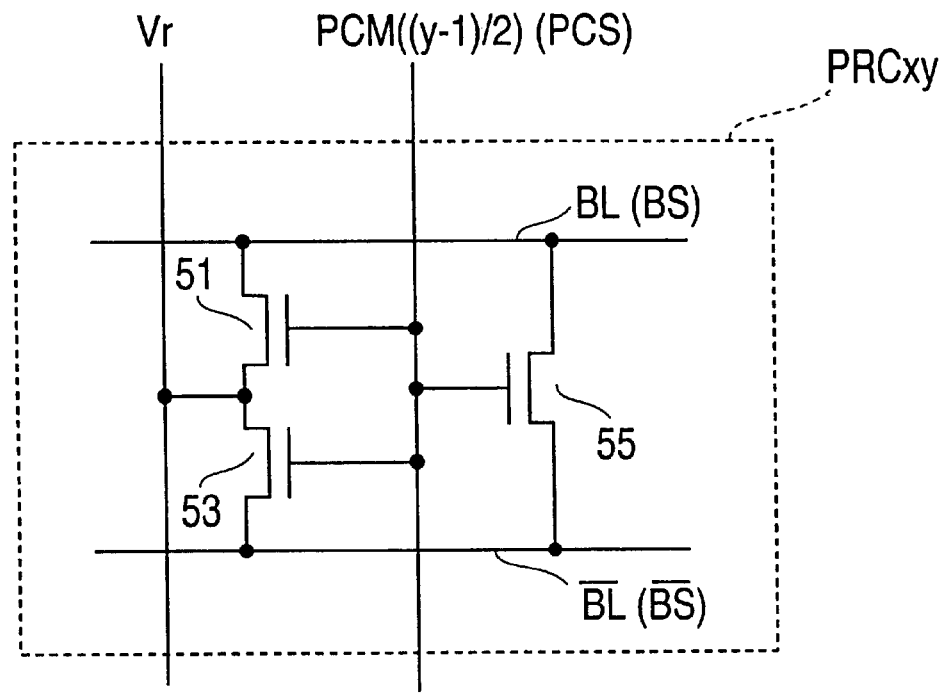
FIG. 4 is a circuit diagram of a pre-charging circuit shown in FIG. 3.

The pre-charging circuit of the first or second pre-charging blocks is shown in FIG. 4. A description below is explained about a pre-charging circuit PRCxy which is connected to a bit line pair BL, /BL (X=0~n, y=1, 3 or 5).

If the description below will be applied for a pre-charging circuit which is connected to the signal line pair, the symbols of BL, /BL shown in FIG. 4 will be replaced with symbols of BS, /BS and the symbol of PCM will be replaced with a symbol of PCS. In this case, y is 2 or 4.

The pre-charging circuit PRCxy is preferably comprised of three N channel type MOS transistors 51, 53, 55. A first electrode of the N channel type MOS transistor 51 is connected to the bit line BL. A first electrode of the N channel type MOS transistor 53 is connected to the bit line /BL. Second electrodes of the N channel type MOS transistors are provided with a predetermined voltage Vr. The predetermined voltage Vr is a pre-charging voltage and is half of the power supply voltage. A first electrode of the N channel type MOS transistor 55 is connected to the bit line BL and a second electrode is connected to the bit line /BL. Gate electrodes of the MOS transistors 51, 53, 55 receive a pre-charging signal PCM((y−1)/2).

In the pre-charging circuit PBCxy, when a logic level of the pre-charging signal PCM((y−1)/2) is "H", the MOS transistors 51, 53, 55 are activated and turn on. So, the predetermined voltage Vr is supplied with the bit line pair BL, /BL through the MOS transistor 51, 53. In other words, the bit line pair Bl, /BL is pre-charged at the pre-charging voltage. The MOS transistor 55 short-circuits between the bit line pair BL, /BL in response to the pre-charging signal PCM((y−1)/2). The MOS transistor 55 is arranged between the bit line pair in order to equalize the voltages between the bit line pair and realize a pre-charging operation at a high speed.

When a logic level of the pre-charging signal PCM((y−1)/2) is "L", the MOS transistors 51, 53, 55 are inactivated and turn off. As a result, the predetermined voltage Vr is not supplied to the bit line pair BL, /BL. That is the bit line pair BL, /BL is not pre-charged. Also, the MOS transistor 55 turns off.

In this embodiment, the pre-charging circuit is comprised of three N channel type MOS transistors, however, the pre-charging circuit can also be comprised of three P channel type MOS transistors. In this case, a logic level of the pre-charging signal is inverted.

Figure 5:
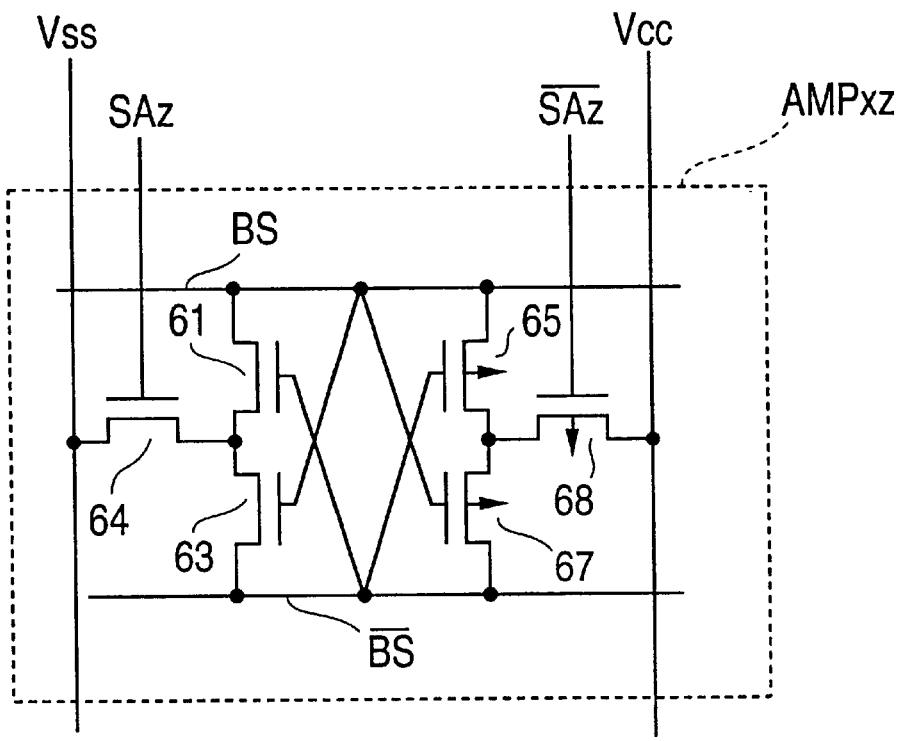
FIG. 5 is a circuit diagram of a sense amplifier shown in FIG. 3.

The sense amplifier circuit of the sense amplifier blocks is shown in FIG. 5. The sense amplifier circuit AMPxz is preferably comprised of three N channel type MOS transistors 61, 63, 64 and three P channel type MOS transistors 65, 67, 68. A first electrode of the N channel type MOS transistor 61 is connected to the signal line BS and a gate electrode is connected to the signal line /BS. A first electrode of the N channel type MOS transistor 63 is connected to the signal line /BS and a gate electrode is connected to the signal line BS. A first electrode of the N type MOS transistor 64 is provided with the ground voltage Vss (0v) and a second electrode is connected to second electrodes of the N channel MOS transistors 61, 63. A gate electrode of the N channel type MOS transistor 64 receives a sense amplifier activating signal SAz (z=0~3).

A first electrode of the P channel type MOS transistor 65 is connected to the signal line BS and a gate electrode is connected to the signal line /BS. A first electrode of the P channel type MOS transistor 67 is connected to the signal line /BS and a gate electrode is connected to the signal line BS. A first electrode of the P type MOS transistor 68 is provided with the power supply voltage Vcc (5v) and a second electrode is connected to second electrodes of the P channel MOS transistors 65, 67. A gate electrode of the P channel type MOS transistor 68 receives a sense amplifier activating signal /SAz. The sense amplifier activating signal SAz and the sense amplifier activating signal /SAz are complementary signal.

In the sense amplifier circuit AMPxz, when a logic level of the sense amplifier activating signal SAZ is "L" and a logic level of the sense amplifier activating signal /SAZ is "H", the N channel type MOS transistor 64 and the P channel transistor 68 are inactive. As a result, the ground voltage Vss is not provided with the second electrodes of the N channel MOS transistors 61, 63. Also, the power supply Vcc is not provided with the second electrodes of the P channel type MOS transistors 65, 67. That is, the sense amplifier circuit AMPxz does not amplify a voltage difference between the signal line pair BS, /BS.

When a logic level of the sense amplifier activating signal SAZ is "H" and a logic level of the sense amplifier activating signal /SAZ is "L", the N channel type MOS transistor 64 and the P channel transistor 68 are active. As a result, the ground voltage Vss is provided with the second electrodes of the N channel MOS transistors 61, 63. Also, the power supply Vcc is provided with the second electrodes of the P channel type MOS transistors 65, 67. That is, the sense amplifier circuit AMPxz amplifies a voltage difference between the signal line pair BS, /BS.

Figure 6:
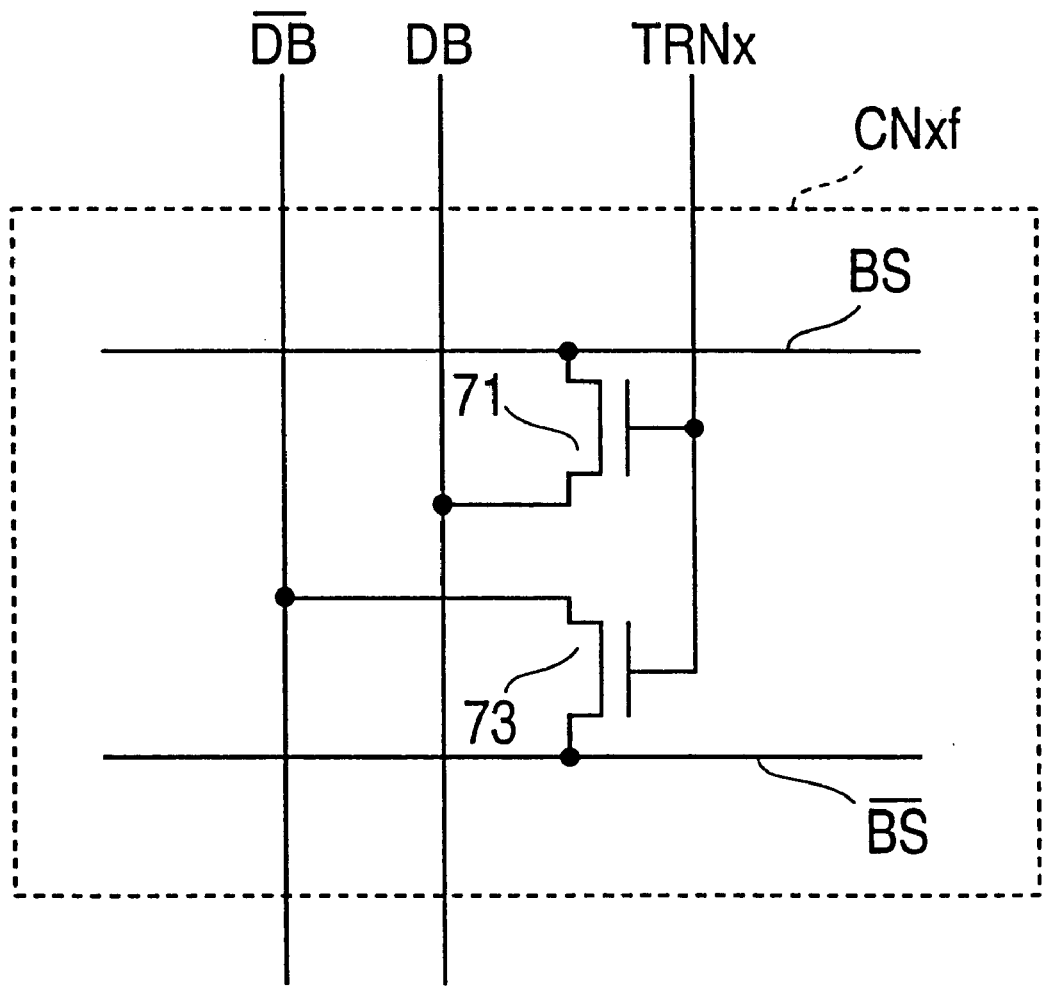
FIG. 6 is a circuit diagram of a gate circuit shown in FIG. 3.

The gate circuit of the gate circuit blocks is shown in FIG. 6. A gate circuit CNxf is comprised of first and second N channel MOS transistors 71, 73 (f=0 or 1). A first electrode of the first N channel MOS transistor 71 is connected to the signal line BS and a second electrode is connected to one (DB) of the data transfer signal line pair DBf. A first electrode of the second N channel MOS transistor 73 is connected to the signal line /BS and a second electrode is connected to another (/DB) of the data transfer signal line pair DBf. Gate electrodes of the first and second N channel type MOS transistors 71, 73 receive the first transfer control signal TRNx.

In this gate circuit CNxf, when a logic level of the first transfer control signal TRNx is "L", the N channel type MOS transistors 71, 73 are inactive. As a result, voltage level on the signal lines BS, /BS is not transferred to the data transfer signal line DB, /DB.

When a logic level of the first transfer control signal TRNx is "H", the N channel type MOS transistors 71, 73 are activated and turn on. As a result, the voltage level on the signal lines BS, /BS is transferred to the data transfer signal line DB, /DB. In other words, the data on the signal line BS, /BS is transferred to the data transfer signal line DB, /DB. The data read out is used as a readout data. On the contrary, in a data writing mode, data on the data transfer signal line DB, /DB is provided to the signal line BS, /BS.

In this embodiment, the gate circuit is preferably comprised of two N channel type MOS transistors, however, the pre-charging circuit can be comprised of two P channel type MOS transistors. In this case, a logic level of the first transfer control signal TRNx is inverted.

Figure 7:
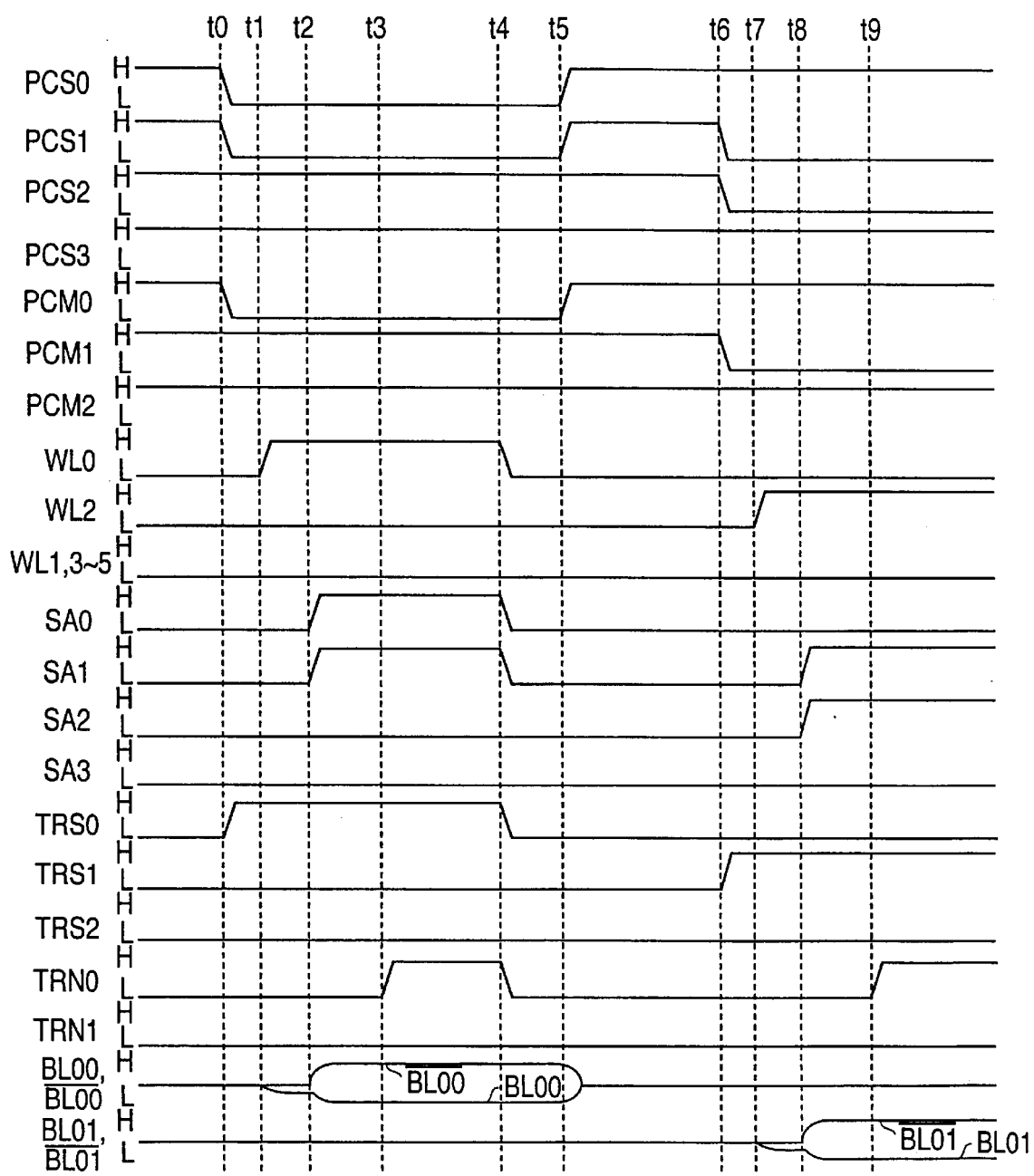
FIG. 7 is a timing chart illustrating an outline of operation of the semiconductor memory device according to the first preferred embodiment.

Here, an outline of read out operation of the DRAM illustrated in FIG. 3 will be described with reference to the timing chart shown in FIG. 7.

In this embodiment, at an initial state, logic levels of the pre-charging signals PCS0 . . . 3 and PCM0 . . . 2 are "H", logic levels of the word lines WL0 . . . 5 are "L", logic levels of the sense amplifier activating signals SA0 . . . 3 are "L" and logic levels of the first and second transfer control signals TRN0, 1 and TRS0 . . . 2 are "L". So, the bit line pairs and the signal line pairs are pre-charged at the half power supply voltage Vcc/2. The bit line pairs BL00, /BL00 and BL01, /BL01 which are used for the read out operation in this embodiment, are shown in FIG. 7. The first transfer control signals TRN2 . . . TRNn are omitted from FIG. 7 and logic levels of these signals are "L".

<time t0>

A logic level of the second transfer control signal TRS0 becomes "H" and logic levels of the pre-charging signals PCS0, PCS1, PCM0 become "L". So, the pre-charging circuits stop to provide the voltage (Vcc/2) to the signal line pairs "BS00, /BS00", "BS10, /BS10" . . . "BSn0, /BSn0" and "BS01, /BS01", "BS11, /BS11" . . . "BSn1, /BSn1" and the bit line pairs "BL00, /BL00", "BL10, /BL10" . . . "BLn0, BLn0". The bit line pairs "BL00, /BL00", "BL10, /BL10" . . . "BLn0, BLn0" are electrically connected to the signal line pairs "BS00, /BS0", "BS10, /BS10" . . . "BSn0, /BSn0" and "BS01, /BS01", "BS11, /BS11" . . . "BSn1, /BSn1".

At the time t0, all pre-charging signal PCS0 . . . PCS3, PCM0 . . . PCM2 can be changed. However, a selective operation as this embodiment is desirable in order to read out data in serial order.

<time t1>

The word line WL0 is selected by the address and a voltage level on the word line WL0 changes to "H". That means memory cells MC connected to the bit lines BL00, BL10 . . . BLn0 are selected. As a result, a voltage level on the bit line BL00 becomes "Vcc/2-α".

<time t2>

Logic levels of the sense amplifier activating signals SA0, SA1 change to "H" and the sense amplifiers AMP00, AMP10 . . . AMPn0 and AMP01, AMP11 . . . AMPn1 are activated. The changing from "L" to "H" of the sense amplifier signals are in response to the changing from "H" to "L" of the pre-charging signals.

Therefore, voltage differences between the bit line pairs "BL00, /BL00" . . . "BLn0, /BLn0" are amplified by the sense amplifier circuit AMP00 . . . AMPn0 through the signal line pairs "BS00, /BS00". . . "BSn0, /BSn0" and the sense amplifier circuit AMP01 . . . AMPn1 through the signal line pairs "BS01, /BS01" . . . "BSn1, /BSn1".

In this embodiment, sense amplifier circuits are located on both ends of the bit line pairs through the signal line pair. The sense amplifier circuits on both sides are activated at once. As the voltage differences between the bit line pairs are amplified at the both sides of the bit line pairs, the time spent for the data readout may be shortened.

<time t3>

A logic level of the first transfer control signal TRN0 transits to "H" in response to the address. That is, the memory cell MC which is connected to the bit line BL00 and the word line WL0 is selected based on the address. A gate circuit CN00 in the gate circuit block 161 becomes in active selectively. So, a data in the selected memory cell MC is transferred to the data transfer signal line pair DB0 through the bit line pair BL00, /BL00, the signal line pair BS01, /BS01 and the gate circuit CN00. That is, the data in the memory cell is read out.

<time t4>

After the data is read out, logic levels of the word line WL0, the sense amplifier activating signal SA0, SA1, the first transfer control signal TRN0 and the second transfer control signal TRS0 become "L" and the read out operation is finished.

<time t5>

Logic levels of the pre-charging signals PCS0, PCS1 and PCM0 become "H" and the DRAM reverts to the initial state. In this embodiment, the transition of such the pre-charging signals are different from the transition of the first transfer control signal TRN0 (time t4). Both signals can be changed at the time t4.

<time t6 . . . t9>

Data stored in the memory cell which is connected to the bit line BL01 and the word line WL2 are read out during this period. So, logic levels of the sense amplifier activating signals SA1, SA2 become "H" at the time t8. Hence, the sense amplifiers AMP01, AMP11 . . . AMPn1 are activated.

Therefore, voltage differences between the bit line pairs "BL01, /BL01" . . . "BLn1, /BLn1" are amplified by the sense amplifier circuit AMP01 . . . AMPn1 through the signal line pairs "BS01, /BS01" . . . "BSn1, /BSn1" and the sense amplifier circuit AMP02 . . . AMPn2 through the signal line pairs "BS02, /BS02" . . . "BSn2, /BSn2".

Similarly, the sense amplifier circuits on both sides of the bit line pairs are activated at once. As the voltage differences between the bit line pairs are amplified at both sides of the bit line pairs, the time spent for the data readout may be shortened.

According to this embodiment, as the sense amplifier circuits having the same structure are located on the both sides of the bit line pairs, it is easy to design new amplifier circuits. Therefore, it may provide a DRAM which functions of a high speed operation, without complicating the DRAM.

Further, as the sense amplifier circuits are arranged between the signal line pairs, it is easy to design about a layout. That is contributed to reduce the size of the DRAM.

A second preferred embodiment will be described below, referring to FIG. 8. The same elements mentioned above are marked at the same symbols and a description thereof is omitted.

Figure 8:
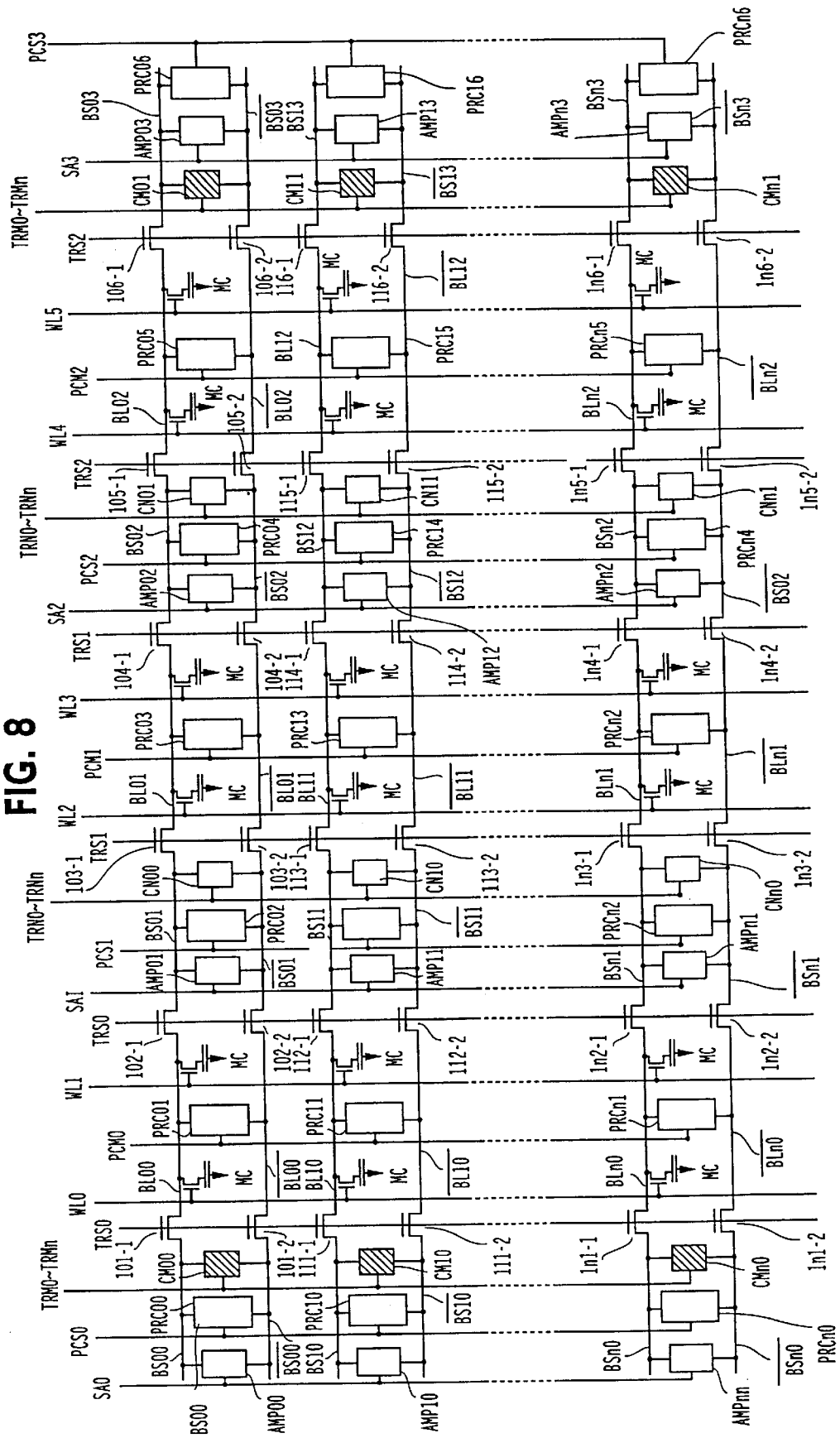
FIG. 8 is a partial circuit diagram of the semiconductor memory device according to the second preferred embodiment.

FIG. 8 illustrates a specific circuits of every block in the memory cell array 1. Most of the elements in FIG. 8 corresponds with those in FIG. 3.

Further, in this embodiment, gate circuits CM00, CM10 . . . CMn0 and CM01, CM11 . . . CMn1 are provided which are connected to the signal line pairs "BS00, /BS00", "BS10, /BS10" . . . "BSn0, /BSn0" and "BS03, /BS03", "BS13, /BS13" . . . "BSn3, /BSn3". These gate circuits are similar to the configuration in FIG. 6. The gate circuits CM00, CM10 . . . CMn0 are connected to the data transfer signal line pair DB0 and the gate circuits CM01, CM11 . . . CMn1 are connected to the data transfer signal line pair DB1.

"The gate circuits CM00, CM10 . . . CMn0 are activated according to the same timing of the activation of the gate circuits CN00, CN10 . . . CNn0. The gate circuits CM01, CM11 . . . CMn1 are activated according to the same timing of the activation of the gate circuits CN01, CN11 . . . CNn1. That is, when the gate circuits CN00 and CN01 become active at the time t3, the gate circuit CM00 and CM01 also become active."

As the gate circuits are located on both sides of the bit line pairs and these gate circuits are activated simultaneously, data transferred from the gate circuits can be compared with each other. Therefore, defective portions in the sense amplifier circuits and the pre-charging circuits can be found. If one gate circuit were defective, another gate circuit could be substituted for the defective gate circuit.

Furthermore, if additional gate circuits according to this embodiment are arranged between the signal line pairs, it prevents any increase in their size.

A third preferred embodiment will be described below, referring to FIG. 9. The same elements mentioned above are marked at the same symbols and a description thereof is omitted.

Figure 9:
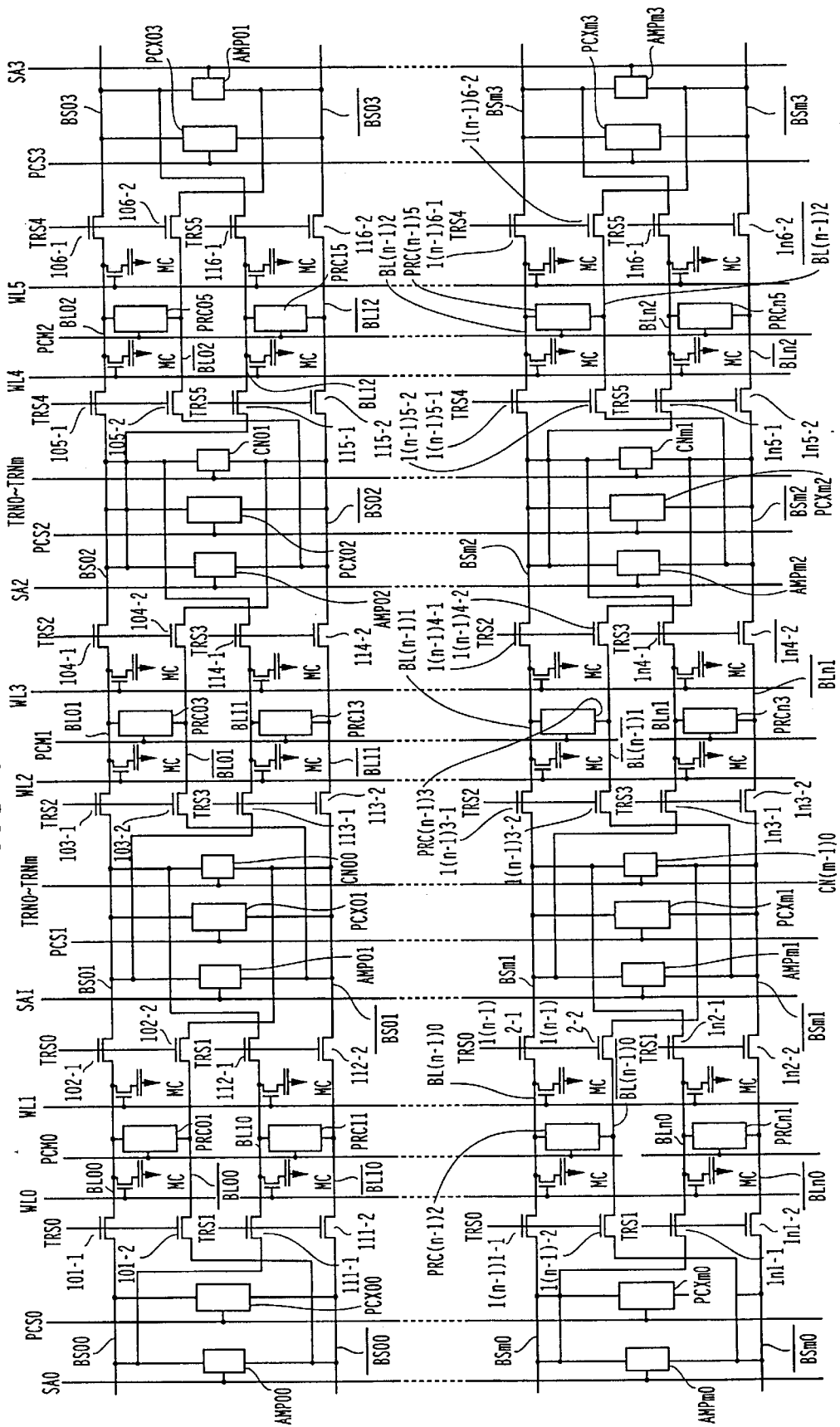
FIG. 9 is a partial circuit diagram of the semiconductor memory device according to the third preferred embodiment.

FIG. 9 illustrates a specific circuit of every block in the memory cell array 1. Most of the elements in FIG. 8 correspond with those in FIG. 3.

In this embodiment, the signal line pairs located on both sides of the bit line pairs are shared. That is, the signal line pair BS00, /BS00 and the signal line pair BS01, /BS01 are electrically connected to each other and are shared.

The signal line pair BS00, /BS00 is connected to the sense amplifier circuit AMP00 and the pre-charging circuit PCX00. The signal line BS00 is electrically connected to the bit line BL00 through the N channel type MOS transistor 101-1. The signal line /BS00 is electrically connected to the bit line /BL00 through the N channel type MOS transistor 101-2. Gate electrodes of the N channel type MOS transistors 101-1 and 101-2 receive the data transfer control signal TRS0. The signal line BS00 is electrically connected to the bit line BL10 through the N channel type MOS transistor 111-1. The signal line /BS00 is electrically connected to the bit line /BL10 through the N channel type MOS transistor 111-2. Gate electrodes of the N channel type MOS transistors 111-1 and 111-2 receive the data transfer control signal TRS1.

The signal line pair BS01, /BS01 is connected to the sense amplifier circuit AMP01, the pre-charging circuit PCX01 and the gate circuit CN00. The signal line BS01 is electrically connected to the bit line BL00 through the N channel type MOS transistor 102-1. The signal line /BS01 is electrically connected to the bit line /BL00 through the N channel type MOS transistor 102-2. Gate electrodes of the N channel type MOS transistors 102-1 and 102-2 receive the data transfer control signal TRS0. The signal line BS01 is electrically connected to the bit line BL10 through the N channel type MOS transistor 112-1. The signal line /BS01 is electrically connected to the bit line /BL10 through the N channel type MOS transistor 112-2. Gate electrodes of the N channel type MOS transistors 112-1 and 112-2 receive the data transfer control signal TRS1.

Similarly, the signal line pair BSm0, /BSm0 is connected to the sense amplifier circuit AMPm0 and the pre-charging circuit PCXm0. The signal line BSm0 is electrically connected to the bit line BL(n-1)0 through the N channel type MOS transistor 1(n-1)1-1. The signal line /BSm0 is electrically connected to the bit line /BL(n-1)0 through the N channel type MOS transistor 1(n-1)1-2. Gate electrodes of the N channel type MOS transistors 1(n-1)1-1 and 1(n-1)1-2 receive the data transfer control signal TRS0. The signal line BSm0 is electrically connected to the bit line BLn0 through the N channel type MOS transistor 1n1-1. The signal line /BSm0 is electrically connected to the bit line /BLn0 through the N channel type MOS transistor 1n1-2. Gate electrodes of the N channel type MOS transistors 1n1-1 and 1n1-2 receive the data transfer control signal TRS1(m=(n-1)/2; n is an odd number).

Similarly, the signal line pair BSm1, /BSm1 is connected to the sense amplifier circuit AMPm1, the pre-charging circuit PCXm1 and the gate circuit CNm0. The signal line BSm1 is electrically connected to the bit line BL(n-1)0 through the N channel type MOS transistor 1(n-1)2-1. The signal line /BSm1 is electrically connected to the bit line /BL(n-1)0 through the N channel type MOS transistor 1(n-1)2-2. Gate electrodes of the N channel type MOS transistors 1(n-1)2-1 and 1(n-1)2-2 receive the data transfer control signal TRS0. The signal line BSm1 is electrically connected to the bit line BLn0 through the N channel type MOS transistor 1n2-1. The signal line /BSm1 is electrically connected to the bit line /BLn0 through the N channel type MOS transistor 1n2-2. Gate electrodes of the N channel type MOS transistors 1n2-1 and 1n2-2 receive the data transfer control signal TRS1.

The signal line BSm1 is electrically connected to the bit line BL(n-1)1 through the N channel type MOS transistor 1(n-1)3-1. The signal line /BSm1 is electrically connected to the bit line /BL(n-1)1 through the N channel type MOS transistor 1(n-1)3-2. Gate electrodes of the N channel type MOS transistors 1(n-1)3-1 and 1(n-1)3-2 receive the data transfer control signal TRS2. The signal line BSm1 is electrically connected to the bit line BLn1 through the N channel type MOS transistor 1n3-1. The signal line /BSm1 is electrically connected to the bit line /BLn1 through the N channel type MOS transistor 1n3-2. Gate electrodes of the N channel type MOS transistors 1n3-1 and 1n3-2 receive the data transfer control signal TRS3.

Similarly, the signal line pair BSm2, /BSm2 is connected to the sense amplifier circuit AMPm2, the pre-charging circuit PCXm2 and the gate circuit CNm1. The signal line BSm2 is electrically connected to the bit line BL(n-1)1 through the N channel type MOS transistor 1(n-1)4-1. The signal line /BSm2 is electrically connected to the bit line /BL(n-1)1 through the N channel type MOS transistor 1(n-1)4-2. Gate electrodes of the N channel type MOS transistors 1(n-1)4-1 and 1(n-1)4-2 receive the data transfer control signal TRS2. The signal line BSm2 is electrically connected to the bit line BLn1 through the N channel type MOS transistor 1n4-1. The signal line /BSm2 is electrically connected to the bit line /BLn1 through the N channel type MOS transistor 1n4-2. Gate electrodes of the N channel type MOS transistors 1n4-1 and 1n4-2 receive the data transfer control signal TRS3.

The signal line BSm2 is electrically connected to the bit line BL(n-1)2 through the N channel type MOS transistor 1(n-1)5-1. The signal line /BSm2 is electrically connected to the bit line /BL(n-1)2 through the N channel type MOS transistor 1(n-1)5-2. Gate electrodes of the N channel type MOS transistors 1(n-1)5-1 and 1(n-1)5-2 receive the data transfer control signal TRS4. The signal line BSm2 is electrically connected to the bit line BLn2 through the N channel type MOS transistor 1n5-1. The signal line /BSm2 is electrically connected to the bit line /BLn2 through the N channel type MOS transistor 1n5-2. Gate electrodes of the N channel type MOS transistors 1n5-1 and 1n5-2 receive the data transfer control signal TRS5.

Similarly, the signal line pair BSm3, /BSm3 is connected to the sense amplifier circuit AMPm3 and the pre-charging circuit PCXm3. The signal line BSm3 is electrically connected to the bit line BL(n-1)2 through the N channel type MOS transistor 1(n-1)6-1. The signal line /BSm3 is electrically connected to the bit line /BL(n-1)2 through the N channel type MOS transistor 1(n-1)6-2. Gate electrodes of the N channel type MOS transistors 1(n-1)6-1 and 1(n-1)6-2 receive the data transfer control signal TRS4. The signal line BSm3 is electrically connected to the bit line BLn2 through the N channel type MOS transistor 1n6-1. The signal line /BSm3 is electrically connected to the bit line /BLn2 through the N channel type MOS transistor 1n6-2. Gate electrodes of the N channel type MOS transistors 1n6-1 and 1n6-2 receive the data transfer control signal TRS5.

Figure 10:
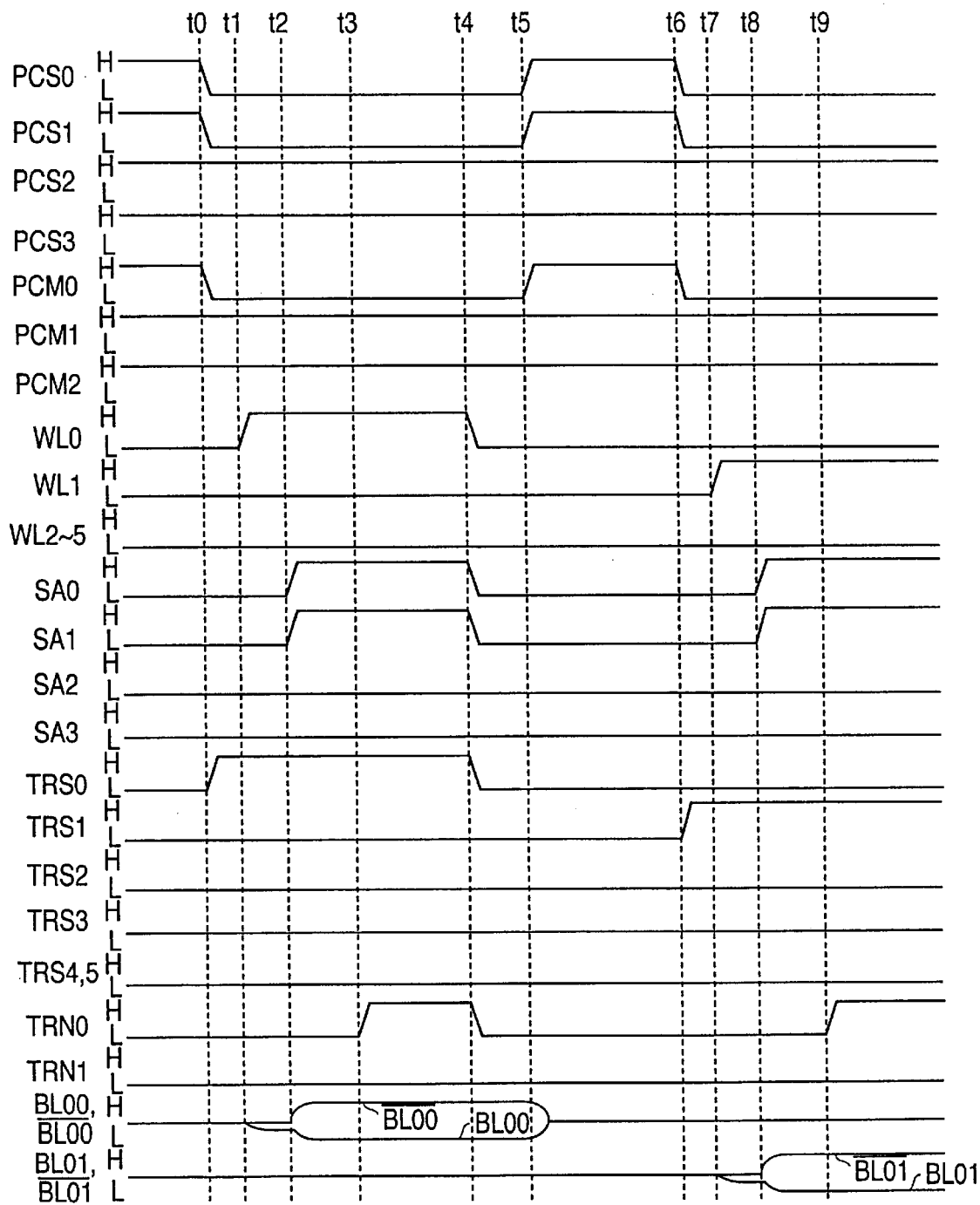
FIG. 10 is a timing chart illustrating an outline of operation of the semiconductor memory device according to the third preferred embodiment.

Here, an outline of a read out operation of the DRAM illustrated in FIG. 9 will be described with reference to the timing chart shown in FIG. 10.

In this embodiment, at an initial state, logic levels of the pre-charging signals PCS0 . . . 3 and PCM0 . . . 2 are "H", logic levels of the word lines WL0 . . . 5 are "L", logic levels of the sense amplifier activating signals SA0 . . . 3 are "L" and logic levels of the first and second transfer control signals TRN0, 1 and TRS0 . . . 5 are "L". So, the bit line pairs and the signal line pairs are pre-charged at a half power supply voltage Vcc/2. The bit line pairs BL00, /BL00 and BL01, /BL01 which are used for the read out operation in this embodiment, are shown in FIG. 10. The first transfer control signals TRN2 . . . TRNn are omitted from FIG. 10 and logic levels of these signals are "L".

<time t0>

"A logic level of the second transfer control signal TRS0 becomes "H" and logic levels of the pre-charging signals PCS0, PCS1, PCM0 become "L". So, the pre-charging circuits stop to provide the voltage (Vcc/2) to the signal line pairs "BS00, /BS00", "BS10, /BS10" . . . "BSm0, /BSm0" and "BS01, /BS01", "BS11, /BS11" . . . "BSm1, /BSm1" and the bit line pairs "BL00, /BL00", "BL10, /BL10" . . . "BLn0, /BLn0". The bit line pairs "BLn0, /BLn0" (n=0 or even number) are electrically connected to the signal line pairs "BSm0, /BSm0" (m=n/2) and "BSm1, /BSm1" (m=n/2)."

<time t1>

The word line WL0 is selected by the address and a voltage level on the word line WL0 changes to "H". That means memory cells MC connected to the bit lines BL00, BL10 . . . BLn0 are selected. So, a voltage level on the bit line BL00 becomes "Vcc/2-α".

<time t2>

Logic levels of the sense amplifier activating signals SA0, SA1 change to "H" and the sense amplifiers AMP00, AMP10 . . . AMPm0 and AMP01, AMP11 . . . AMPm1 are activated. Therefore, voltage differences on the bit line pairs "BLn0, /BLn0" (n=0 or even number) are amplified by the sense amplifier circuits which are connected to the signal line pair "BSm0, /BSm0" (m=n/2). Voltage differences on the bit line pairs "BLn0, /BLn0"(n=0 or even number) are amplified by the sense amplifier circuits which are connected to the signal line pair "BSm1, /BSm1"(m=n/2).

In this embodiment, sense amplifier circuits are located on both ends of the bit line pairs through the signal line pair. The sense amplifier circuits on both sides are activated at once. As the voltage differences between the bit line pairs are amplified at both sides of the bit line pairs, the time spent for the data readout may be shortened.

<time t3>

A logic level of the first transfer control signal TRN0 transits to "H" in response to the address. That is, the memory cell MC which is connected to the bit line BL00 and the word line WL0 is selected based on the address. A gate circuit CN00 in the gate circuit block 161 becomes active selectively. So, a data in the selected memory cell MC is transferred to the data transfer signal line pair DB0 through the bit line pair BL00, /BL00, the signal line pair BS01, /BS01 and the gate circuit CN00. That is, the data in the memory cell is read out.

<time t4>

After the data is read out, logic levels of the word line WL0, the sense amplifier activating signal SA0, SA1, the first transfer control signal TRN0 and the second transfer control signal TRS0 become "L" and the read out operation is finished.

<time t5>

Logic levels of the pre-charging signals PCS0, PCS1 and PCM0 become "H" and the DRAM reverts to the initial state.

<time t6>

A logic level of the second transfer control signal TRS1 becomes "H" and logic levels of the pre-charging signals PCS0, PCS1, PCM0 become "L". So, the pre-charging circuits stop to provide the voltage (Vcc/2) to the signal line pairs "BS00, /BS00", "BS10, /BS10" . . . "BSm0, /BSm0" and "BS01, /BS01", "BS11, /BS11" . . . "BSm1, /BSm1" and the bit line pairs "BL00, /BL00", "BL10, /BL10" . . . "BLn0, /BLn0".

"The bit line pairs "BLn0, /BLn0" (n: odd number) are electrically connected to the signal line pairs "BSm0, /BSm0" (m=(n−1)/2) and "BSm1, /BSm1" (m=(n−1) /2)."

<time t7>

The word line WL1 is selected by the address and a voltage level on the word line WL1 changes to "H". That means memory cells MC connected to the bit lines BL10 . . . BLn0 are selected. So, a voltage level on the bit line BL10 becomes "Vcc/2-α".

<time t8>

Logic levels of the sense amplifier activating signals SA0, SA1 change to "H" and the sense amplifiers AMP00, AMP10 . . . AMPm0 and AMP01, AMP11 . . . AMPm1 are activated. Therefore, voltage differences on the bit line pairs "BLn0, /BLn0" (n: odd number) are amplified by the sense amplifier circuits which are connected to the signal line pair "BSm0, /BSm0"(m=(n−1)/2). Voltage differences on the bit line pairs "BLn0, /BLn0" (n: odd number) are amplified by the sense amplifier circuits which are connected to the signal line pair "BSm1, /BSm1"(m=(n−1)/2).

In this embodiment, sense amplifier circuits are located on both ends of the bit line pairs through the signal line pair. The sense amplifier circuits on the both sides are activated at once.

<time t9>

A logic level of the first transfer control signal TRN0 transits to "H" in response to the address. That is, the memory cell MC which is connected to the bit line BL10 and the word line WL1 is selected based on the address. A gate circuit CN00 in the gate circuit block 161 becomes active selectively. So, data in the selected memory cell MC is transferred to the data transfer signal line pair DB0 through the bit line pair BL10, /BL10, the signal line pair BS01, /BS01 and the gate circuit CN00. That is, the data in the memory cell is read out.

The second transfer control signals TRS0 . . . TRS5 are generated by the column address decoder 10. For example, the second transfer control signals TRS0 . . . TRS5 are generated by dividing the second transfer control signals TRS0 . . . TRS2 in the first preferred embodiment.

According to the third preferred embodiment, numbers of the signal lines, the pre-charging circuits connected to the signal lines, the sense amplifier circuits and the gate circuits can be reduced, as compared with the first preferred embodiment besides obtaining the effect of the first preferred embodiment. Therefore, it is possible to provide such a DRAM which is comprised of a minimum number of transistors. That is, the goal of reducing the size and costs of the DRAM can be realized.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semiconductor memory device comprising:
    a first memory cell block including a plurality of bit line pairs, a plurality of word lines which cross the plurality of bit line pairs, a plurality of memory cells, wherein each memory cell is connected to one of the bit line pairs and one of the word lines;
    a plurality of first signal line pairs, wherein each first signal line pair is connected to a first end of respective ones of the plurality of bit line pairs so as to receive data from the bit line pairs;
    a plurality of second signal line pairs, wherein each second signal line pair is connected to a second end of respective ones of the plurality of bit line pairs so as to receive data from the bit lines pairs;
    a plurality of first transfer control circuits, each connecting respective ones of the plurality of first signal line pairs with respective ones of the plurality of bit line pairs in response to a first control signal so as to transfer data;
    a plurality of second transfer control circuits, each connecting respective ones of the plurality of second signal line pairs with respective ones of the plurality of bit line pairs in response to the first control signal so as to transfer data;
    a plurality of first sense amplifiers, each connected to respective ones of the first signal line pairs and operating to amplify a voltage difference between the first signal line pair in response to a first activating signal; and
    a plurality of second sense amplifiers, each connected to respective ones of the second signal line pairs and operating to amplify a voltage difference between the second signal line pair in response to the first activating signal.

2. The semiconductor memory device according to claim 1, further comprising:
    a plurality of first pre-charging circuits and a plurality of second pre-charging circuits,
    wherein each first pre-charging circuit is connected to respective ones of the plurality of first signal line pairs and sets a voltage of the first signal line pair to a pre-charging voltage in response to a first pre-charging signal, and
    wherein each second pre-charging circuit is connected to respective ones of the plurality of second signal line pairs and sets a voltage of the second signal line pair to the pre-charging voltage in response to the first pre-charging signal.

3. The semiconductor memory device according to claim 2, further comprising a plurality of first gate circuits, wherein each first gate circuit is connected to respective ones of the plurality of first signal line pairs and transfers data on the first signal line pair to a data line pair in response to a transfer signal.

4. The semiconductor memory device according to claim 3, further comprising a plurality of second gate circuits, wherein each second gate circuit is connected to respective ones of the plurality of second signal line pairs and transfers data on the second signal line pair to a data line pair in response to the transfer signal.

5. The semiconductor memory device according to claim 2, further comprising:
    a second memory cell block including a plurality of second bit line pairs;
    a plurality of second word lines which cross the plurality of second bit line pairs;
    a plurality of second memory cells, wherein each second memory cell is connected to respective ones of the second bit line pairs and respective ones of the second word lines; and
    a plurality of third transfer control circuits, wherein each third transfer control circuit connects respective ones of the plurality of first signal line pairs with respective ones of the plurality of second bit line pairs of the second memory cell block in response to a second control signal so as to transfer data.

6. The semiconductor memory device according to claim 1, further comprising a plurality of first gate circuits, wherein each first gate circuit is connected to respective ones of the plurality of first signal line pairs and transfers data on the first signal line pair to a data line pair in response to a transfer signal.

7. The semiconductor memory device according to claim 6, further comprising a plurality of second gate circuits, wherein each second gate circuit is connected to respective ones of the plurality of second signal line pairs and transfers data on the second signal line pair to a data line pair in response to the transfer signal.

8. The semiconductor memory device according to claim 7, further comprising:
    a second memory cell block including a plurality of second bit line pairs;
    a plurality of second word lines which cross the plurality of second bit line pairs;
    a plurality of second memory cells, wherein each second memory cell is connected to respective ones of the second bit line pairs and respective ones of the second word lines; and
    a plurality of third transfer control circuits, wherein each third transfer control circuit connects respective ones of the plurality of first signal line pairs with respective ones of the plurality of second bit line pairs of the second memory cell block in response to a second control signal so as to transfer data.

9. The semiconductor memory device according to claim 6, further comprising:
    a second memory cell block including a plurality of second bit line pairs;
    a plurality of second word lines which cross the plurality of second bit line pairs;
    a plurality of second memory cells, wherein each second memory cell is connected to respective ones of the second bit line pairs and respective ones of the second word lines; and
    a plurality of third transfer control circuits, wherein each third transfer control circuit connects respective ones of the plurality of first signal line pairs with respective ones of the plurality of second bit line pairs of the second memory cell block in response to a second control signal so as to transfer data.

10. The semiconductor memory device according to claim 1, further comprising:
    a second memory cell block including a plurality of second bit line pairs;
    a plurality of second word lines which cross the plurality of second bit line pairs;
    a plurality of second memory cells, wherein each second memory cell is connected to respective ones of the second bit line pairs and respective ones of the second word lines; and a plurality of third transfer control circuits, wherein each third transfer control circuits connects respective ones of the plurality of first signal line pairs with respective ones of the plurality of bit line pairs of the second memory cell block in response to a second control signal so as to transfer data.

11. A semiconductor memory device comprising:

a first memory cell block which includes first and second bit line pairs, wherein the first bit line pair comprises first and second bit lines and the second bit line pair comprises third and fourth bit lines, a first word line which crosses the first and second bit line pairs, a first memory cell which is connected to the first bit line and the first word line, and a second memory cell which is connected to the third bit line and the first word line;

a first signal line pair which is selectively connected to either a first end of the first bit line pair or a first end of the second bit line pair so as to receive data from the first or second bit line pairs;

a second signal line pair which is selectively connected to either a second end of the first bit line pair or a second end of the second bit line pair so as to receive data from the first or second bit line pairs;

a first transfer control circuit which connects the first signal line pair with the first bit line pair in response to a first control signal so as to receive data from the first bit line pair;

a second transfer control circuit which connects the second signal line pair with the first bit line pair in response to the first control signal so as to receive data from the first bit line pair;

a third transfer control circuit which connects the first signal line pair with the second bit line pair in response to a second control signal so as to receive data from the second bit line pair;

a fourth transfer control circuit which connects the second signal line pair with the second bit line pair in response to the second control signal so as to receive data from the second bit line pair;

a first amplifier which is connected to the first signal line pair and amplifies a voltage difference on the first signal line pair in response to a first activating signal; and a second amplifier with is connected to the second signal line pair and amplifies a voltage difference on the second signal line pair in response to the first activating signal.

12. The semiconductor memory device according to claim 11, further comprising:

a first pre-charging circuit which is connected to the first signal line pair and sets a voltage of the first signal line pair to a predetermined voltage in response to a first pre-charging signal; and a second pre-charging circuit which is connected to the second signal line pair and sets a voltage of the second signal line pair to the predetermined voltage in response to the first pre-charging signal.

13. The semiconductor memory device according to claim 12, further comprising a gate circuit which is connected to the first signal line pair and transfers data on the first signal line pair to a data line pair in response to a transfer signal.

14. The semiconductor memory device according to claim 13, further comprising a second memory cell block which includes third and fourth bit line pairs, wherein the third bit line pair comprises fifth and sixth bit lines and the fourth bit line pair comprises seventh and eighth bit lines, a second word line which crosses the third and fourth bit line pairs, a third memory cell which is connected to the fifth bit line and the second word line, a fourth memory cell which is connected to the seventh bit line and the second word line, a fifth transfer control circuit which connects the first signal line pair with the third bit line pair in response to a third control signal, and a sixth transfer control circuit which connects the first signal line pair with the fourth bit line pair in response to a fourth control signal.

15. The semiconductor memory device according to claim 12, further comprising a second memory cell block which includes third and fourth bit line pairs, wherein the third bit line pair comprises fifth and sixth bit lines and the fourth bit line pair comprises seventh and eighth bit lines, a second word line which crosses the third and fourth bit line pairs, a third memory cell which is connected to the fifth bit line and the second word line, a fourth memory cell which is connected to the seventh bit line and the second word line, a fifth transfer control circuit which connects the first signal line pair with the third bit line pair in response to a third control signal, and a sixth transfer control circuit which connects the first signal line pair with the fourth bit line pair in response to a fourth control signal.

16. The semiconductor memory device according to claim 11, further comprising a gate circuit which is connected to the first signal line pair and transfers data on the first signal line pair to a data line pair in response to a transfer signal.

17. The semiconductor memory device according to claim 16, further comprising a second memory cell block which includes third and fourth bit line pairs, wherein the third bit line pair comprises fifth and sixth bit lines and the fourth bit line pair comprises seventh and eighth bit lines, a second word line which crosses the third and fourth bit line pairs, a third memory cell which is connected to the fifth bit line and the second word line, a fourth memory cell which is connected to the seventh bit line and the second word line, a fifth transfer control circuit which connects the first signal line pair with the third bit line in response to a third control signal, and a sixth transfer control circuit which connects the first signal line pair the fourth bit line pair in response to a fourth control signal.

18. The semiconductor memory device according to claim 11, further comprising a second memory cell block which includes third and fourth bit line pairs, wherein the third bit line pair comprises fifth and sixth bit lines and the fourth bit lines pair comprises seventh and eighth bit lines, a second word line which crosses the third and fourth bit line pairs, a third memory cell which is connected to the fifth bit line and the second word line, a fourth memory cell which is connected to the seventh bit line and the second word line, a fifth transfer control circuit which connects the first signal line pair with the third bit line pair in response to a third control signal, and a sixth transfer control circuit which connects the first signal line with the fourth bit line pair in response to a fourth control signal.

19. A semiconductor memory device comprising:

a bit line pair which includes a first bit line and a second bit line and extends from a first point to a second point;

a memory cell which is connected to the first bit line between the first point and the second point, said memory cell storing data therein;

a first sense amplifier which is arranged in the vicinity of the first point and amplifies a voltage difference between the first and second bit lines in response to a sense amplifier activating signal during a sensing period; and a second sense amplifier which is arranged in the vicinity of the second point and amplifies a voltage difference between the first and second bit lines in response to the sense amplifier activating signal during the sensing period.

20. The semiconductor memory device according to claim 19, further comprising a first gate circuit and a second gate circuit, wherein the first gate circuit connects the bit line pair with the first sense amplifier in response to a control signal during the sensing period, and wherein the second gate circuit connects the bit line pair with the second sense amplifier in response to the control signal during the sensing period.

* * * * *